United States Patent [19]

Taplin

[11] Patent Number: 4,757,745

[45] Date of Patent: Jul. 19, 1988

[54] MICROWAVE ANTENNA AND DIELECTRIC PROPERTY CHANGE FREQUENCY COMPENSATION SYSTEM IN ELECTROHYDRAULIC SERVO WITH PISTON POSITION CONTROL

[75] Inventor: Lael B. Taplin, Union Lake, Mich.

[73] Assignee: Vickers, Incorporated, Troy, Mich.

[21] Appl. No.: 19,189

[22] Filed: Feb. 26, 1987

[51] Int. Cl.[4] .......................... F15B 13/16; G01R 27/04; F01B 25/26

[52] U.S. Cl. .......................................... 91/361; 342/61; 324/58.5 B; 92/5 R

[58] Field of Search .................... 342/61, 86, 123, 124, 342/127, 199, 27–28; 324/58.5 R, 58.5 B, 58.5 C; 91/1, 275, 361, 459; 92/5 R

[56] References Cited

U.S. PATENT DOCUMENTS

| | | | |
|---|---|---|---|
| 3,188,634 | 6/1965 | Thompson | 342/127 X |
| 3,290,678 | 12/1966 | Carlsson | 342/199 |
| 3,577,144 | 10/1968 | Girault | 342/127 X |
| 3,589,177 | 6/1971 | Merlo | 324/58.5 C X |
| 3,680,092 | 7/1972 | Scott | 342/127 X |
| 3,680,099 | 7/1972 | Herman et al. | 342/199 |
| 3,680,101 | 7/1972 | Granqvist | 342/127 |
| 3,688,188 | 8/1972 | Bak et al. | 324/58.5 C |
| 3,798,642 | 3/1974 | Augenblick et al. | 342/61 X |
| 3,854,133 | 12/1974 | Cabion | 342/127 |
| 4,044,354 | 8/1977 | Bosher et al. | |
| 4,107,684 | 8/1978 | Watson | 342/86 |
| 4,238,795 | 12/1980 | Schiek et al. | 342/127 |
| 4,359,683 | 11/1982 | Chivers | 324/58.5 B |
| 4,381,485 | 4/1983 | Steinbrecher | 324/58.5 R X |
| 4,588,953 | 5/1986 | Krage | 324/58.5 C |
| 4,689,553 | 8/1987 | Haddox | 324/58.5 C |

FOREIGN PATENT DOCUMENTS

| | | | |
|---|---|---|---|
| 883828 | 12/1961 | United Kingdom | 324/58.5 R |

*Primary Examiner*—Robert E. Garrett
*Assistant Examiner*—George Kapsalas
*Attorney, Agent, or Firm*—Barnes, Kisselle, Raisch, Choate, Whittemore & Hulbert

[57] ABSTRACT

An electrohydraulic servo system which includes an actuator having a cylinder and a piston variably positioned therewithin, a servo valve responsive to valve control signals for coupling the actuator to a source of hydraulic fluid, and control electronics responsive to piston position for generating the valve control signals. A variable frequency rf generator is coupled through associated directional couplers to a pair of antennas which are positioned within the actuator cylinder and physically spaced from each other in the direction of piston motion by an odd multiple of quarter-wavelengths at a nominal generator output frequency. A phase detector receives the reflected signal outputs from the directional couplers, and provides an output through an integrator to the frequency control output of the generator to automatically compensate frequency of the rf energy radiated into the cylinder and thereby maintain electrical quarter-wavelength spacing between the antennas against variations in dielectric properties of the hydraulic fluid due to changes in fluid temperature, etc. A second phase detector is coupled to the generator and one antenna to generate a piston position signal.

8 Claims, 1 Drawing Sheet

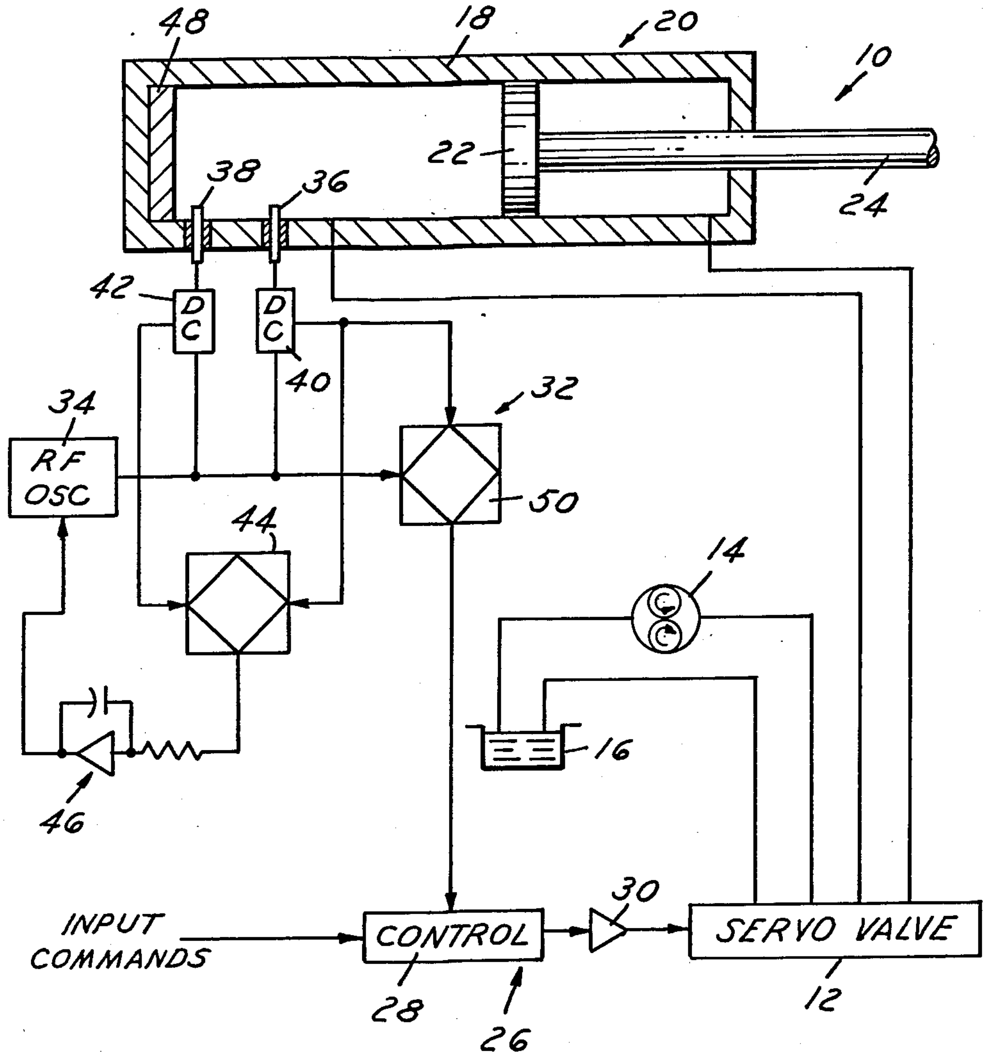
48
18
20
10
22
24
38
36
42
D C
D C
40
34
RF OSC
32
50
44
14
16
46
30
INPUT COMMANDS
CONTROL
SERVO VALVE
28
26
12

MICROWAVE ANTENNA AND DIELECTRIC PROPERTY CHANGE FREQUENCY COMPENSATION SYSTEM IN ELECTROHYDRAULIC SERVO WITH PISTON POSITION CONTROL

BACKGROUND OF THE INVENTION

1. Field of the Invention

The present invention is directed to position measuring devices, and more particularly to apparatus for determining position of the actuator piston in an electrohydraulic servo valve and actuator system.

2. Brief description of the Prior Art

In electrohydraulic servo systems which embody a servo valve coupled to a hydraulic actuator, it is conventional practice to monitor actuator position using an electroacoustic linear displacement transducer for example as marketed by Temposonics Inc. of Plainview, N.Y. and disclosed in U.S. Pat. No. 3,898,555. This transducer includes a magnet coupled to the actuator piston for motion conjointly therewith, and an electroacoustic waveguide adjacent to the path of the magnet. A current pulse is launched on a wire which extends through the waveguide and coacts with the field of the magnet to propagate an acoustic signal within the waveguide. A coupler or mode converter receives such acoustic signal, with the time between launching of the current pulse and receipt of the acoustic signal being a function of position of the magnet relative to the waveguide. This transducer is durable, is directly mounted on the actuator cylinder but magnetically rather than physically coupled to the actuator piston, and is capable of providing an accurate indication of actuator piston position. However, conventional electronics for obtaining such position reading are overly complex and inordinately expensive. Furthermore, such electronics are conventionally supplied in a separate package which must be appropriately positioned and protected in the actuator operating environment.

Copending U.S. application Ser. No. 849,540, filed Apr. 8, 1986 and assigned to the assignee hereof, discloses an electrohydraulic servo valve assembly which includes a servo valve and microprocessor-based control electronics mounted in a single package for connection to hydraulic equipment, such as a linear actuator. In a particular implementation of such disclosure in a servo-valve/linearactuator combination, improved circuitry is featured for monitoring operation of the Temposonics-type electroacoustic transducer. An initial current pulse is launched in the waveguide in response to a measurement demand from the microprocessor-based control electronics, and a counter is simultaneously reset. Upon receipt of the acoustic return pulse from the waveguide, the counter is automatically incremented and a current pulse is relaunched in the waveguide. The output of the counter includes facility for preselecting a number of launch/return cycles in the waveguide, and for generating an interrupt signal to the microprocessor-based control electronics to indicate that the preselected number of recirculations has been reached. An actuator position reading is stored in a clock which measures the amount of time between the initial measurement demand signal and the interrupt signal. The clock output is transmitted to the control microprocessor on demand.

Although the combination of the Temposonics-type transducer and monitoring electronics disclosed in such copending application is considerably less expensive than that previously proposed, and is reliable in long-term operation, improvements remain desirable. For example, electronics for obtaining a measurement reading in the disclosure of such copending application occupy one-third of the total electronics package. Reduction in the quantity of required circuitry is desirable to reduce power dissipation and increase space available for implementing other control features. Furthermore, although a measurement reading is obtained very quickly relative to motion of the actuator piston, the system of the copending application does not continuously monitor piston position in real time.

Copending application U.S. Ser. No. 962,103 filed Nov. 3, 1986 and likewise assigned to the assignee hereof, discloses an electrohydraulic servo valve control system in which a coaxial transmission line is formed within the actuator to include a center conductor coaxial with the actuator and an outer conductor. A bead of ferrite or other suitable magnetically permeable material is magnetically coupled to the piston and surrounds the center conductor of the transmission line for altering impedance characteristics of the transmission line as a function of position of the piston within the cylinder. Position sensing electronics include an oscillator coupled to the transmission line for launching electromagnetic radiation, and a phase detector responsive to radiation reflected from the transmission line for determining position of the piston within the actuator cylinder. In a preferred embodiment, the coaxial transmission line includes a tube, with centrally suspended center conductor and a slidable bead of magnetically permeable material, projecting from one end of the actuator cylinder into a central aperture extending through the opposing piston. In another embodiment, the outer conductor of the transmission line is formed by the actuator cylinder, and the center conductor extends into the piston aperture in sliding contact therewith as the piston moves axially of the cylinder. The systems so disclosed, although providing improved economy and performance as compared with the prior art, thus require modification of actuator designs to form the piston aperture. Furthermore, such systems, particularly the second described embodiment, remain susceptible to temperature variations within the actuator and consequent change in properties of the dielectric material within the transmission line.

A general object of the present invention, therefore, is to provide apparatus for determining position of a piston within an electrohydraulic actuator which is inexpensive to implement, which reduces overall quantity of circuitry necessary to monitor piston motion, which is adapted to continuously monitor motion in real time, which is accurate to a fine degree of resolution, which is reliable over a substantial operating lifetime, and which automatically compensates for variations in dielectric properties of the hydraulic fluid due to temperature variations, etc.

SUMMARY OF THE INVENTION

An electrohydraulic servo system in accordance with the invention includes an actuator such as a linear or rotary actuator having a cylinder and a piston variably positionable therewithin. A servo valve is responsive to valve control signals for coupling the actuator to a source of hydraulic fluid. Electronics responsive to position of the piston within the cylinder for generating valve control signals include an rf generator having a frequency control input, an antenna structure coupled to the generator for radiating rf energy within the cylinder, and circuitry responsive to variations in dielectric properties of the hydraulic fluid within the cylinder for providing a control signal to the frequency control input of the generator to automatically compensate frequency of rf energy radiated within the cylinder for variations in fluid dielectric properties and consequent variations in velocity of propagation, etc.

In a preferred embodiment of the invention, the antenna structure comprises first and second antennas positioned within the cylinder and physically spaced from each other in the direction of piston motion—i.e., longitudinally or axially of the cylinder—by an odd multiple of quarter-wavelengths of rf energy at a preselected or nominal output frequency of the rf generator. The rf generator output is coupled to the antennas through respective directional couplers. A phase detector is coupled to the output of each directional coupler and provides an output signal which varies as a function of phase angle of energy reflected from the piston and received at each of the antennas. The output of the phase detector is coupled to the generator frequency control input through an integrator so as to automatically adjust the oscillator output frequency to maintain electrical quarter-wavelength spacing between the antennas and a zero output from the phase detector.

In Ithe preferred embodiment of the invention, the piston position-indicating electronics includes a second phase detector having a first input coupled to the output of the directional coupler associated with the antenna closer to the piston, and a second input coupled to the output of the rf generator. The output of the second phase detector is thus responsive to phase angle of energy reflected from the piston and provides a direct real-time indication of piston position to servo valve control electronics.

BRIEF DESCRIPTION OF THE DRAWING

The invention, together with additional objects, features and advantages thereof, will be best understood from the following description, the appended claims and the accompanying drawing which is a schematic diagram of an electrohydraulic servo valve and actuator system which features piston position monitoring circuitry in accordance with a presently preferred embodiment of the invention.

DETAILED DESCRIPTION OF PREFERRED EMBODIMENT

The drawing illustrates an electrohydraulic servo system 10 as comprising a servo valve 12 having a first set of inlet and outlet ports connected through a pump 14 to a source 16 of hydraulic fluid, and a second set of ports connected to the cylinder 18 of a linear actuator 20 on opposed sides of the actuator piston 22. Piston 22 is connected to a shaft 24 which extends through one axial end wall of cylinder 18 for connection to a load (not shown). Servo electronics 26 include control electronics 28, preferably microprocessor-based, which receive input commands from a master controller or the like (not shown), and provide a pulse width modulated drive signal through an amplifier 30 to servo valve 12. Position monitoring apparatus 32 in accordance with the present invention is responsive to actuator piston 22 for generating a position feedback signal to control electronics 28. Thus, for example, in a closed-loop position control mode of operation, control electronics 28 may provide valve drive signals to amplifier 30 as a function of a difference between the input command signals from a remote master controller and positioned feedback signals from position monitoring apparatus 32.

In accordance with a preferred embodiment of the invention illustrated in the drawing, apparatus 32 comprises an rf oscillator 34 for generating energy at radio frequency as a function of signals at a frequency control oscillator input. A pair of stub antennas 36, 38 are positioned within and project into cylinder 18 of actuator 20, and are physically spaced from each other in the direction of motion of piston 22 by an odd multiple of quarter-wavelengths at a preselected nominal or design output frequency of oscillator 34. The output of oscillator 34 is connected to antennas 36, 38 through respective directional couplers 40, 42. The reflected signal outputs of couplers 40, 42 are connected to associated inputs of a phase detector 44 which has its output coupled through an integrator 46 to the frequency control input of oscillator 34. A disc 48 of microwave absorption material is positioned at the end wall of cylinder 18 remotely of piston 22. The reflected signal output of antenna 36 adjacent to piston 22 is also fed to one input of a phase detector 50, which receives a second input from oscillator 34 and provides a position-indicating output to control electronics 28.

In operation, antennas 36, 38 at quarter-wavelength spacing propagate rf energy toward piston 22, while energy in the opposite direction is virtually cancelled. Any residual energy is absorbed at disc 48. Energy reflected by piston 22 and received at antenna 36 is phase-compared with the output of oscillator 34 at detector 50, and the phase differential provides a position-indicating signal to control electronics 28. In the meantime, and as long as the reflected signals at antennas 36, 38 remain at electrical quarter-wavelength spacing with respect to the frequeny of oscillator 34, the output of phase detector 44 is zero. However, in the event that dielectric properties of hydraulic fluid within the cylinder 18 vary, because of temperature and pressure for example, such that the velocity of propagation changes, the reflected energies at antennas 36, 38 correspondingly vary from electrical quarterwavelength spacing and the output of phase detector 44 varies from zero. Such phase detector output variation is sensed at integrator 46, which provides a corresponding signal to the frequency control input of oscillator 34. The oscillator output frequency is correspondingly varied upwardly or downwardly until the output of phase detector 44 returns to the zero level. Thus, the output frequency of oscillator 34 is automatically controlled to compensate for variations in dielectric properties of the medium—i.e., the hydraulic fluid—through which position-measuring energy is propagated to and from piston 22.

It will be appreciated that the preferred embodiment of the invention hereinabove described is subject to any number of modifications and variations without departing from the principles of the invention. For example, the invention is by no means limited to use in conjunction with linear actuators of the type illustrated in the drawing, but may be employed equally as well in conjunction with rotary actuators or any other type of actuator in which the cylinder and the piston cooperate to form a radiation cavity. Nor is the invention limited to use of reflected energy for position-measuring purposes. For example, the position-indicating electronics could be responsive to energy absorbed within the cylinder/piston cavity by monitoring the frequency of absorption resonances. In applications in which the fluid temperature does not vary, or in which fluid properties do not vary markedly with temperature, the structure of the invention may be employed for temperature compensation of oscillator 34.

The invention claimed is:

1. An electrohydraulic servo system which includes an actuator having a cylinder and a piston variably positionable therewithin, a servo valve responsive to valve control signals for coupling said actuator to a source of hydraulic fluid, and means responsive to position of said piston within said cylinder for generating said valve control signals, characterized in that said position-responsive means comprises an rf generator having a frequency control input, antenna means positioned within said cylinder and coupled to said generator for radiating rf energy within said cylinder, means coupled to said antenna means and responsive to rf energy at said antenna means for indicating position of said piston within said cylinder, and means responsive to variations in dielectric properties of said hydraulic fluid within said cylinder for providing a control signal to said frequency control input of said generator to automatically compensate frequency of said rf energy for variations in said dielectric properties.

2. The system set forth in claim 1 wherein said antenna means comprises first and second antennas positioned within said cylinder and physically spaced from each other longitudinally of said cylinder by an odd multiple of quarter-wavelengths of rf energy at a preselected frequency of said generator.

3. The system set forth in claim 2 wherein said variations-responsive means comprises means responsive to phase angle between rf energies at said first and second antennas.

4. The system set forth in claim 2 wherein said variations-responsive means comprises a phase detector having inputs coupled to said first and second antennas and an output, and an integrator having an input coupled to said output of said phase detector at an output coupled to said control input of said rf generator.

5. The system set forth in claim 4 wherein said variations-responsive means further comprises first and second directional couplers connected between said generator, respective ones of said first and second antennas, and respective ones of said phase detector inputs.

6. The system set forth in claim 5 wherein said positionindicating means comprises a second phase detector having inputs coupled to said generator and to a one of said antennas adjacent to said piston.

7. An electrohydraulic servo system which includes an actuator having a cylinder and a piston variably positionable therewithin, a servo valve responsive to valve control signals for coupling said actuator to a source of hydraulic fluid, and means responsive to position of said piston within said cylinder for generating said valve control signals, characterized in that said position-responsive means comprises an rf generator having a frequency control input, antenna means positioned within said cylinder and coupled to said generator for radiating rf energy within said cylinder, said antenna means comprising first and second antennas positioned within said cylinder and physically spaced from each other longitudinally by an odd multiple of quarter-wavelengths of rf energy at a preselected frequency of said generator, means coupled to said antenna means and responsive to rf energy at said antenna means for indicating position of said piston within said cylinder, and means responsive to phase angle between rf energies at said first and second antennas for providing a control signal to said frequency control input of said generator to automatically compensate frequency of said rf energy for temperature variations.

8. The system set forth in claim 7 wherein said phase-angle-responsive means comprises a phase detector having inputs coupled to said first and second antennas and an output, and an integrator having an input coupled to said output of said phase detector at an output coupled to said control input of said rf generator.

* * * * *